United States Patent [19]

Bazhenov et al.

[11] 4,017,705
[45] Apr. 12, 1977

[54] IMPULSE CURRENT GENERATOR FOR ELECTROEROSION MACHINING OF METALS

[76] Inventors: Sergei Nikolaevich Bazhenov, ulitsa Pushkinskaya, 32, kv. 4; Efim Mordukhovich Belyavsky, ulitsa Tonkopia, 8b, kv. 115, both of Kharkov,, U.S.S.R.

[22] Filed: May 14, 1975

[21] Appl. No.: 577,546

[52] U.S. Cl. .................. 219/69 C; 219/69 P; 307/108; 321/2
[51] Int. Cl.² .................................. B23P 1/02
[58] Field of Search ......... 321/2, 45 R; 307/88 HP, 307/107, 108; 219/69 C, 69 P; 315/227 A

[56] References Cited

UNITED STATES PATENTS

| | | | |
|---|---|---|---|
| 3,090,872 | 5/1963 | Thompson | 307/88 MP |
| 3,485,990 | 12/1969 | Sennowitz | 219/69 C |
| 3,786,334 | 1/1974 | Johannessen | 307/108 |

FOREIGN PATENTS OR APPLICATIONS

| | | | |
|---|---|---|---|
| 24,664 | 7/1971 | Japan | 219/69 C |
| 320,922 | 12/1971 | U.S.S.R. | 307/108 |

*Primary Examiner*—William H. Beha, Jr.
*Attorney, Agent, or Firm*—Lackenbach, Lilling & Siegel

[57] ABSTRACT

An inverter generates a series of pulses which are differentiated by the coupling capacitors and rectified by the rectifier circuit to produce a series of short pulses which are all directed in the same direction or have the same polarity and are suitable for electroerosion machining of metals.

2 Claims, 7 Drawing Figures

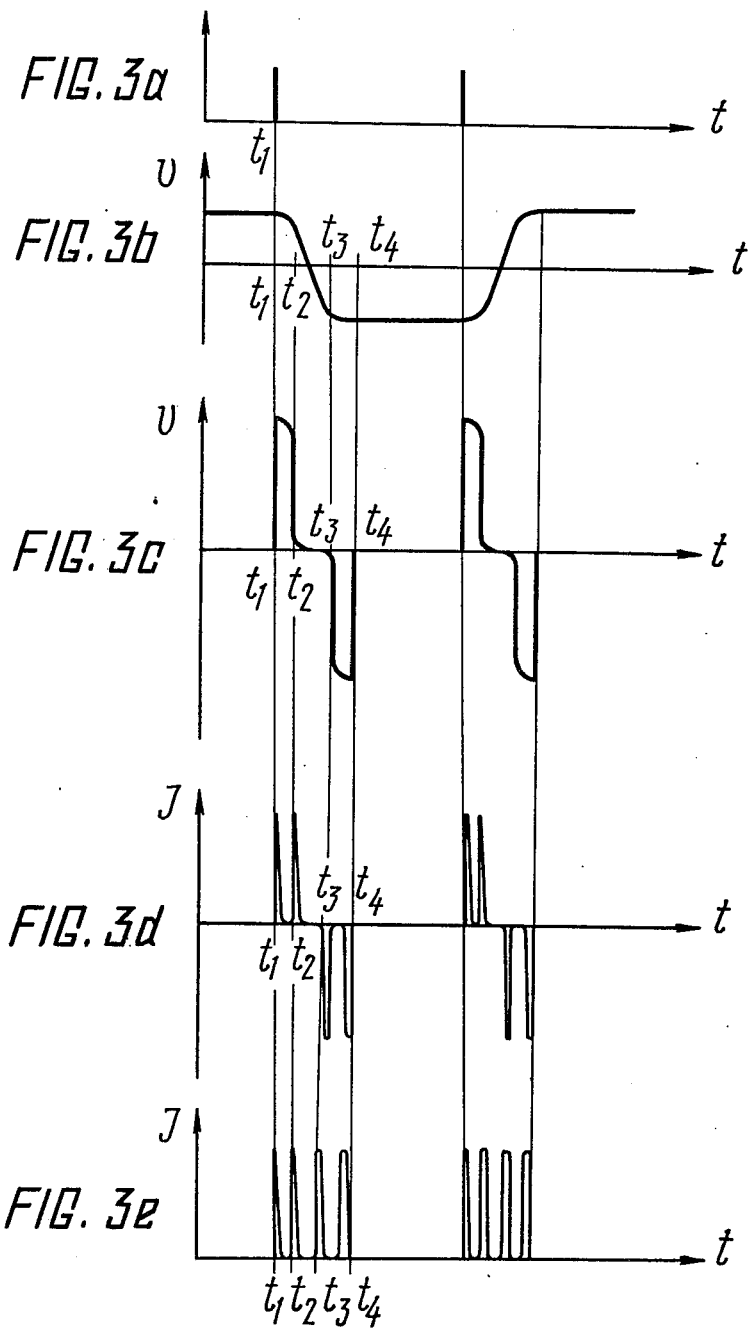

IMPULSE CURRENT GENERATOR FOR ELECTROEROSION MACHINING OF METALS

The invention relates to the art of electroerosion machining of metals, and in particular to an impulse current generator for electroerosion machining of metals to be used as supply source for electroerosion cutting or punching machine tools for punching tiny holes and cutting shaped apertures using a thin wire tool.

Prior art impulse current generators for electroerosion machining of metals incorporate circuits built on the basis of series inverters.

A prior art generator for electroerosion machining of metals comprises a series inverter having at least one power supply source including controlled rectifiers controlled by a control circuit, two chokes having their windings with first and second ends, the chokes being connected in series with their first ends, and a storage capacitor connected to the junction point of the first ends of the choke windings so as to form, in combination with each of the choke windings and a respective controlled rectifier, recharge circuits of the storage capacitor, the output of the series inverter being coupled to the input of a rectifier circuit having three input terminals and two output terminals, connected to a load, wherein each input terminal is connected to the second end of the winding of the first choke, to the junction point of the first ends of the choke windings and to the second end of the winding of the second choke, respectively.

The controlled rectifiers of the above-described generator may comprise both thyristors and thyratrons.

The above-described prior art impulse current generator for electroerosion machining of metals is deficient in that it does not provide for shaping pulses of a length within the range from 0.2 to 2µus at a repetition rate of 100 kHz and higher since with such circuit arrangement the length and repetition rate of pulses are limited either by the restitution time of the blocking capacity of a thyristor (where thyristors are used) or by the deionization time of a thyratron (where thyratrons are used).

Another disadvantage of the prior art impulse current generator for electroerosion machining resides in that such generator cannot ensure the shaping of pulse trains required for electroerosion applications such as punching of tiny holes and cutting of shaped apertures using a thin wire tool. For the employment of the prior art generator with the shaping of pulse trains, a plurality of series inverters should be incorporated in its circuit arrangement, the inverters operating in a sequence and having a complicated control circuit enabling such sequential operation of the inverters.

It is an object of the invention to provide an impulse current generator for electroerosion machining of metals which permits to shape pulse trains.

Another object of the invention is to provide a generator shaping short powerful pulses at a high repetition rate.

In accordance with these and other objects, the invention consists in the provision of an impulse current generator for electroerosion machining of metals built on the basis of a series inverter having at least one power supply source comprising controlled rectifiers controlled by a control circuit, two chokes having their windings with first and second ends and interconnected with the first ends of their windings, and a storage capacitor connected to the junction point of the first ends of the choke windings so as to form, together with each of the windings and with a respective controlled rectifier, a recharge circuit of the storage capacitor, the output of the series inverter being electrically coupled to the input of a rectifier circuit having three input terminals and two output terminals, the first input terminal being connected to the junction point of the first ends of the choke windings, and the output terminals being coupled to a load, wherein, according to the invention, there are provided two capacitors, each being connected to the second end of a respective choke winding and providing the electric coupling of the output of the series inverter to the input of the rectifier circuit so as to form, together with a respective choke winding, an independent circuit for shaping pulses of the output current of the generator.

The invention will now be described with reference to specific embodiments thereof illustrated in the accompanying drawings in which.

Figure 1:
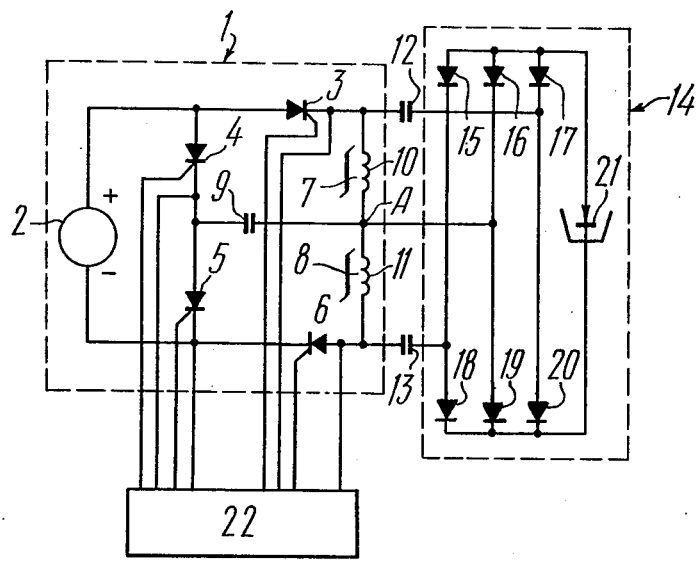
FIG. 1 shows a wiring diagram of an impulse current generator for electroerosion machining of metals according to the invention.

FIGS. 3a,b,c,d,e show current and voltage diagrams for various points of circuit of the impulse current generator for electroerosion machining of metals according to the invention.

The impulse current generator for electroerosion machining of metals comprises a series inverter 1 (FIG. 1) including a power supply source comprising a DC voltage source the numeral 2. The series inverter 1 comprises a conventional bridge circuit with controlled rectifiers — thyristors 3,4,5,6, chokes 7 and 8 and a storage capacitor 9. Windings 10 and 11 of the chokes 7 and 8 are connected in series and have a junction point A common for the first ends of the windings 10 and 11 to which the storage capacitor 9 is connected. The second end of the winding 10 is connected to a capacitor 12, and the second end of the winding 11 is connected to a capacitor 13. The thyristor 3, the choke 7, the thyristor 5 and the DC voltage source 2 form a first recharge circuit of the storage capacitor 9.

A rectifier circuit 14 comprises a conventional circuit arrangement including diodes 15,16,17,18,19 and 20 and has three input terminals and two output terminals. The first input terminal is connected to the capacitor 12 providing the electric coupling of the output of the series inverter 1 to the input of the rectifier circuit 14, the second input terminal is connected to the junction point A of the first ends of the windings 10 and 11 of the chokes 7 and 8, and the third input terminal is connected to the capacitor 13 providing the electric coupling of the output of the series inverter 1 to the input of the rectifier circuit 14.

A load comprising an erosion gap 21 of an electroerosion machine tool (not shown) is connected to the output terminals of the rectifier circuit 14.

The control electrodes of all the thyristors 3,4,5 and 6 are connected to the inputs of a control circuit 22 comprising a conventional multivibrator having two outputs connected to each thyristor at which there are shaped two control pulse trains shifted relative to each other at a half-cycle.

As the controlled rectifiers, the thyristors may be replaced by thyratrons, the wiring diagram remaining the same as described above.

Figure 2:
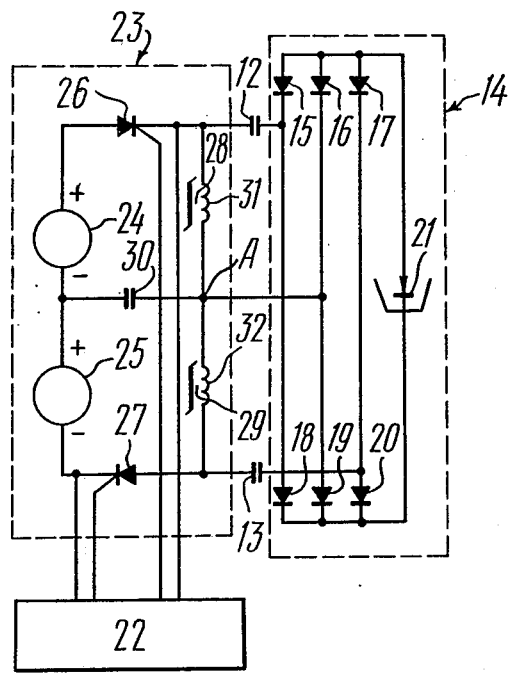
FIG. 2 shows a wiring diagram of another embodiment of an impulse current generator for electroerosion machining of metals according to the invention.

The diagram of the impulse current generator for electroerosion machining of metals shown in FIG. 2 illustrates another embodiment of a series inverter 23 different from that shown in FIG. 1. The inverter 23 (FIG. 2) has two series-connected DC voltage sources 24 and 25, two controlled rectifiers comprising thyristors 26 and 27, two chokes 28 and 29 and a storage capacitor 30.

Windings 31 and 32 of the chokes 28 and 29 are also connected in series to each other. The source 24, thyristor 26 and choke 31 form a first recharge circuit of the capacitor 30, and the second recharge circuit of the capacitor 30 is formed by the source 25, choke 32 and thyristor 27.

FIG. 3 shows diagrams of current and voltage versus time at various points of circuit of the impulse current generator for electroerosion machining of metals.

The diagram in FIG. 3a shows control pulses fed from the circuit 22 (FIG. 1) controlling the thyristors.

The diagram in FIG. 3b shows voltage U as a function of time t at the storage capacitor 9 (FIG. 1).

The diagram in FIG. 3c shows voltage U as a function of time t at the winding 10 of the choke 7 (FIG. 1).

The diagram in FIG. 3d shows current pulses 1 as a function of time t at the capacitor 12 (FIG. 1).

The diagram in FIG. 3e shows pulse trains of the output current 1 flowing during the time t through the load comprising the electroerosion gap 21.

The impulse current generator for electroerosion machining of metals according to the invention functions as follows:

The generator connected to the electroerosion gap 21 (FIG. 1) of an electroerosion machine tool is energized by energizing the DC voltage source 2 and the control circuit 22.

The first control pulse from the control circuit 22 fed at an instant $t_1$ (FIG. 3a) makes conductive the thyristors 3 and 5 (FIG. 1) of the first recharge circuit of the storage capacitor 9.

Thus, a current pulse appears which flows from the DC voltage source 2 via the first circuit to recharge the storage capacitor 9 (FIG. 3b).

At the same instant $t_1$, the full voltage of the charged storage capacitor 9 (FIG. 1) and DC voltage source 2 is applied to the winding 10 of the choke 7 to saturate it (FIG. 3c) and upon saturation of the choke 7 (FIG. 1), the voltage across the winding 10 (FIG. 1) drops to zero value at the instant $t_2$ (FIG. 3c).

At the instant $t_3$ (FIG. 3b) corresponding to the completion of the recharging cycle of the storage capacitor 9 (FIG 1) the core of the choke 7 returns into the initial state of magnetization, and a voltage pulse again appears across the winding 10 thereof (FIG. 3c) which persists till the instant $t_4$ which corresponds to the final recharging of the storage capacitor 9 (FIG. 1).

At the instants $t_1$, $t_2$, $t_3$, $t_4$ (FIG. 3) corresponding to changes in voltage across the winding 10 of the choke 7 (FIG. 1) short pulses flow through the capacitor 12 (FIG. 3d) corresonding to the recharging of this capacitor 12 (FIG. 1) appearing upon changes in voltage across the winding 10 of the choke 7.

The repetition rate of these current pulses and the length thereof depend only on the parameters of the choke 10, storage capacitor 9 and capacitor 12, and do not depend on the parameters of the thyristors 3 and 5.

These pulses are fed to the erosion gap 21 (FIG. 1) after processing in the rectifier circuit 14 (FIG. 3e).

The steepness of the leading edge of the current pulses is determined by the parameters of the choke 7, as well as by the resistance of the rectifier circuit 14 and of the erosion gap 21.

A train of output current pulses of the generator flows through the erosion gap 21, the number of pulses in the train depending of the number of changes in voltage across the winding of the choke 7, the number of pulses in the train being equal to four when using ideal thyristors (with the backward current equal to nil).

With the backward current of the thyristors other than nil, the number of pulses in train can be greater.

Upon completion of the recharging of the capacitor 9, the thyristors 3 and 5 are blocked under the backward voltage generated across the recharged storage capacitor 9.

This voltage is maintained for a time period at least equal to the time required for restitution of the blocking capacity of the thyristors 3 and 5 of the first circuit. This time period defines the minimal rest period between pulse trains, and after the lapse of this time, the control circuit 22 generates a second pulse (FIG. 3a) to make conductive the thyristors 4 and 6 of the second circuit, and the process is repeated as described above beginning with the time instant $t_1$(FIG. 3).

The impulse current generator for electroerosion machining of metals shown in FIG. 2 operates in the same manner as that described above, the control circuit alternately making conductive the thyristors 26 and 27.

The impulse current generator for electroerosion machining of metals according to the invention is intended for use as power supply source of an electroerosion machine tool to ensure a high productivity thereof when perfoming the highgrade finish in punching tiny holes and cutting shaped apertures using a thin wire tool in any medium including industrial water and solutions of weak electrolytes.

The advantage of the generator according to the invention consists in its ability of shaping trains of powerful and short pulses with a length within the range from 0.5 to 5$\mu$us, steepness of the leading edge of up to 200 A/$\mu$us and pulse frequency within the trains of up to 500 kHz, the repetition rate of the pulse trains being equal to 20 kHz.

The number of pulses in the trains is four, and the amplitude is as high as 70A.

The generator has the provision for operation with a largely variable load.

The impulse current generator for electroerosion machining of metals according to the invention may also be used in the art of electrothermal treatment.

What is claimed is:

1. An impulse current generator for electroerosion machining of metals comprising: a series inverter; at least one power supply source of said series inverter; controlled rectifiers of said series inverter; a control circuit for said rectifiers connected to said rectifiers; a first choke of said series inverter; a second choke of said series inverter; a winding of said first choke having a first end and a second end; a winding of said second choke having a first end and a second end, the first end being connected to the first end of said winding of said first choke; a storage capacitor of said series inverter connected to said first ends of said windings of said first and second chokes; each said choke winding, said respective controlled rectifiers and said respective one power supply source forming an independent recharge circuit of said storage capacitor; a rectifier circuit electrically coupled to the input of said series inverter and having three input terminals and two output terminals; a first differentiating capacitor providing said electric coupling of the output of said series inverter to said rectifier circuit, said first differentiating capacitor being connected between the second end of said winding of said first choke and said first input terminal of said rectifier circuit so as to form, together with said winding of said first choke, a circuit for shaping pulses of the output current of the generator; and a second differentiating capacitor providing said electric coupling of the output of said series inverter to said rectifier circuit, said second differentiating capacitor being connected between the second end of said winding of said second choke and said second input terminal of said rectifier circuit so as to form, together with said winding of said second choke, a circuit for shaping the pulses of the output current of the generator, said third input terminal of said rectifier circuit being connected to said first ends of said windings of said first and second chokes, said two output terminals of said rectifier circuit being adapted to be connected to a load, whereby a series of short pulses suitable for electroerosion machining of metals are produced and are all directed in the same direction or have the same polarity.

2. An impulse current generator as defined in claim 1, wherein said chokes comprise saturable reactors.

* * * * *